United States Patent
Tatosian et al.

[11] Patent Number: 5,956,352
[45] Date of Patent: Sep. 21, 1999

[54] ADJUSTABLE FILTER FOR ERROR DETECTING AND CORRECTING SYSTEM

[75] Inventors: David Adrian Tatosian, Stow; Donald Wayne Smelser, Bolton; Paul Marshall Goodwin, Littleton, all of Mass.

[73] Assignee: Digital Equipment Corporation, Maynard, Mass.

[21] Appl. No.: 08/710,482

[22] Filed: Sep. 9, 1996

Related U.S. Application Data

[63] Continuation of application No. 08/394,041, Feb. 24, 1995, abandoned, which is a continuation of application No. 07/872,978, Apr. 24, 1992, abandoned.

[51] Int. Cl.$^6$ .................................................. G11C 29/00
[52] U.S. Cl. .................................... 371/40.18; 395/183.18
[58] Field of Search .............................. 371/22, 3, 10.1, 371/21.1, 26, 51, 40.1, 40.4; 395/183.18, 183, 21

[56] References Cited

U.S. PATENT DOCUMENTS

| | | | |
|---|---|---|---|
| 3,906,200 | 9/1975 | Petschaver | 371/21.6 X |
| 3,917,933 | 11/1975 | Scheuneman | 371/21.6 X |
| 4,535,455 | 8/1985 | Peterson | 371/21.6 X |
| 4,604,750 | 8/1986 | Manton et al. | 371/38 |
| 4,617,664 | 10/1986 | Aichelmann, Jr. et al. | 371/38 |
| 4,670,880 | 6/1987 | Jitsukawa et al. | 371/36 |
| 4,748,627 | 5/1988 | Ohsawa | 371/13 X |
| 4,782,486 | 11/1988 | Lipcon et al. | 371/21 |
| 4,964,130 | 10/1990 | Bowden, III et al. | 371/21.6 X |
| 5,155,731 | 10/1992 | Yamaguchi | 371/16.5 |

*Primary Examiner*—Reba I. Elmore
*Assistant Examiner*—Sheela S. Rao
*Attorney, Agent, or Firm*—Krishnendu Gupta

[57] ABSTRACT

An adjustable filter for a computing system having memory error detecting and correcting features selectively masks user-specified errors, thereby preventing storage of such errors in a control and status register (CSR). The invention includes a command and data register 102; a CSR 103; an error detecting and correcting circuit 108, including a check bit generator 108a, an error detecting circuit 108b, and an error correcting circuit 108c; a memory module 114; and filter logic 300. The contents of a filter control register 220 of the CSR 103 operate to specify a particular error which is to be "filtered". The filter logic 300 includes a plurality of logic gates that compare the user-specified signals stored in the register 220 with error-related signals reported by the error detecting circuit 108b. If the signals match, information associated with the detected error is prevented from being stored in the CSR 103.

9 Claims, 3 Drawing Sheets

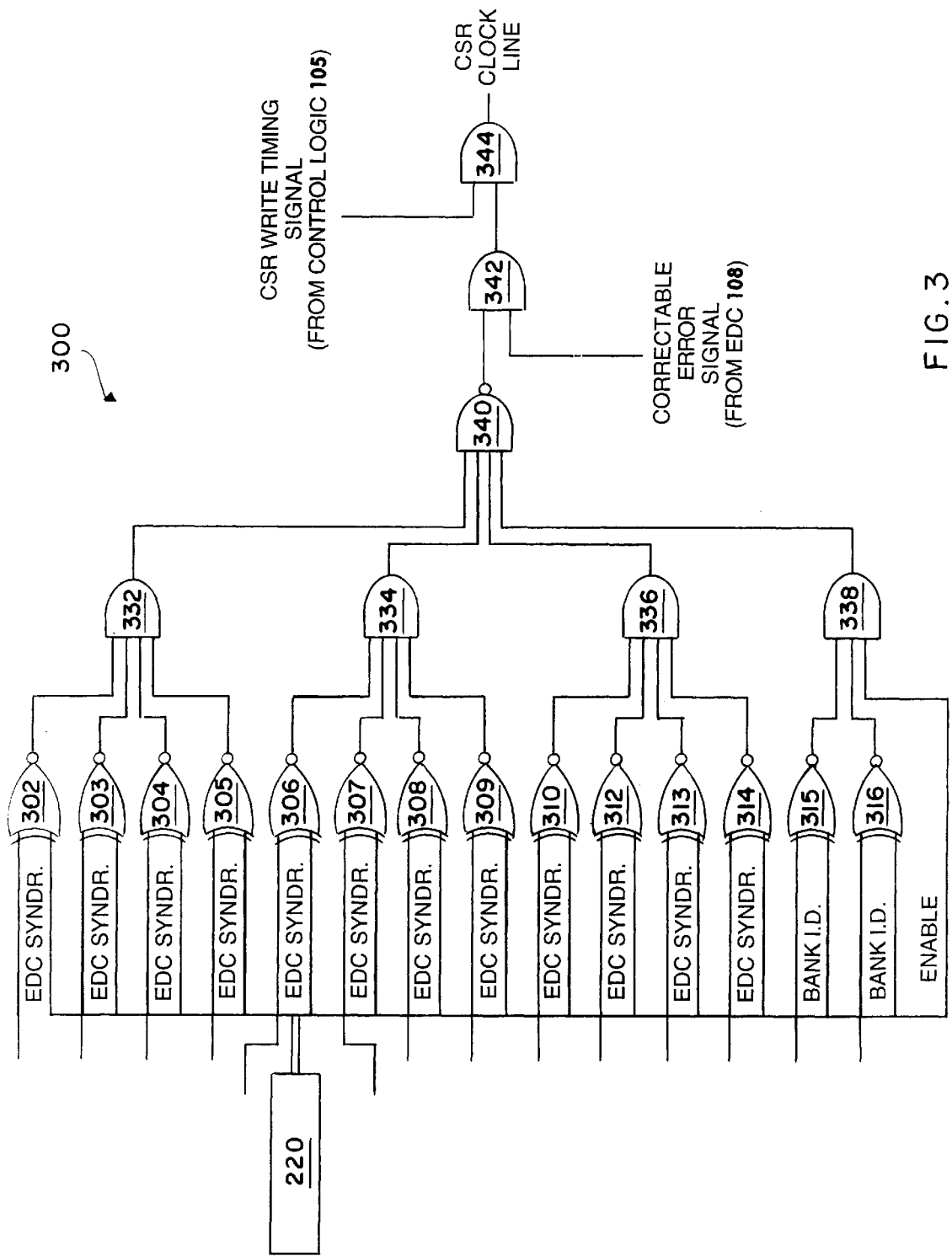

ADJUSTABLE FILTER FOR ERROR DETECTING AND CORRECTING SYSTEM

This application is a continuation of application Ser. No. 08/394,041, filed Feb. 24, 1995, abandoned, which is a continuation of application Ser. No. 07/872,978, filed Apr. 24, 1992, abandoned.

BACKGROUND OF THE INVENTION

1. Field of Invention

The present invention relates to a memory system having error correcting and detecting (EDC) circuitry, for use in an electronic computing system. More particularly, the invention relates to an electronic data processing system having a user-configurable filter for selectively masking errors encountered in reading and writing data to and from a memory module in the system.

2. Description of Related Art

One of the most important features of most electronic computing systems is their memory. Typically the term "memory" is used to mean the volatile memory of a computing system, otherwise known as random access memory (RAM), or simply "memory". RAM only maintains its stored data as long as it receives electrical power; without electrical power, the RAM contents are lost. However, RAM offers a number of advantages over non-volatile memories, the chief advantage being the speed at which data can be written to and read from the RAM.

Sometimes errors occur when data is read from or written to memory. The first step in rectifying such errors is to identify the error that occurred, as well as various signals present in the computing system at the time of the error. In some computing systems, these signals are generated by various circuit components and stored in one or more control and status registers, called "CSRs". For example, a typical CSR might be provided with some of the following items: an indication of what type of error occurred, the memory address that was being written to or read from when the error occurred, a number of check bits associated with the data that was being written to or read from memory when the error occurred, and specialized error correcting signals called "syndromes" associated with the data that was being written or read at the time of the memory error.

Although CSRs are useful in solving memory problems in many applications, there are other applications in which further improvement would be helpful. Specifically, a need to minimize memory size usually mandates that only a small number of CSRs are utilized. Typically, one CSR is provided for each "memory module", wherein a memory module comprises a collection of cooperating memory banks. Each time a new memory error occurs, the data associated with that error is written into the CSR associated with the memory module where the error occurred. If at the time of the new memory error the CSR already contains data corresponding to a previous error, the previous data would be effectively deleted, or "written-over". Accordingly, a CSR at any given time is more likely to contain data associated with a frequently occurring memory error then data from an infrequent error. Data from a one-time or otherwise infrequent memory error will normally only be present in a CSR until the next memory error occurs. As a result, central processing components that utilize information obtained from CSRs are sometimes unable to detect the infrequent errors, thereby reducing the effectiveness of the computing system's fault management programs. The overall effect is that the computing system's reliability is diminished.

One approach to this problem might be to record a CSR's contents each time a memory error occurs in an alternate storage location, such as non-volatile memory, and to search these alternate storage locations for errors of interest. This approach is not as efficient as might be desired, however, since recording the CSR contents in the alternate storage location takes additional time, which may well delay the operation of the memory. Furthermore, this approach is also inefficient since it requires the alternate storage location to provide a large amount of memory to accommodate the frequently-occurring errors, even if the error of real interest is an infrequent error such as a one-time error.

BRIEF SUMMARY OF INVENTION

The present invention is directed at the problems set forth above. Generally, the invention comprises a filter system that selectively keeps a user-selected memory error from being recorded in a CSR associated with the memory module where the error occurred. The invention helps to preserve the contents of a CSR by keeping information associated with a relatively frequent known memory error from overwriting data already stored in the CSR.

The system of the invention makes use of a command and data register that receives data and commands from a CPU bus; a CSR; an error detecting and correcting circuit, including a check bit generator, an error detecting circuit, and an error correcting circuit; a memory module; and filter logic.

The CSR of the present invention includes a filter control register, which is not written-over when memory errors occur. The filter control register is structured to receive and store a user-specified pattern of bits, which are stored in the filter control register by writing those bits to the CPU bus. These bits identify a specific memory error that the user desires to filter. In other words, when the error identified in the filter control register occurs, information associated with that error is prevented from being stored in the CSR.

The contents of the filter control register are delivered to the filter logic. Each time a memory error occurs, certain bits of the filter control register are compared to syndrome bits associated with the error, and certain other bits of the filter control register are compared to memory bank identifying bits produced by the error detecting circuit. If the contents of the filter control register correspond to the syndrome and the memory bank associated with the memory error that has occurred, the filter logic provides a signal to the CSR that effectively prevents the CSR from storing information associated with that error.

DESCRIPTION OF DRAWINGS

The nature of the invention, as well as objects and advantages thereof, will become more apparent to those skilled in the art after consideration of the following detailed description in connection with the accompanying drawings, in which like reference numerals designate like parts throughout, wherein:

FIG. 3 is an electrical schematic diagram illustrating filter logic 300 of the present invention.

DESCRIPTION OF A PREFERRED EMBODIMENT

Figure 1:
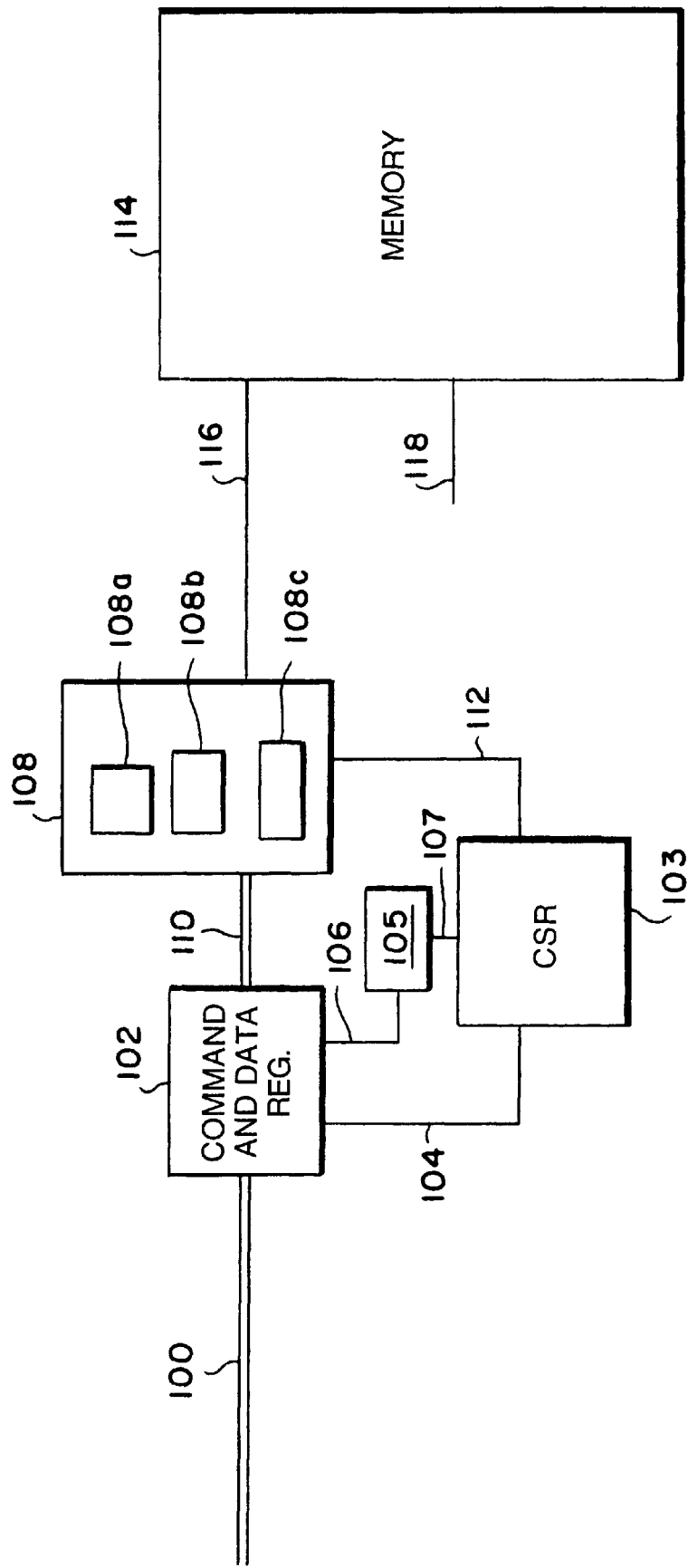
FIG. 1 is a block electrical schematic diagram illustrating the read/write path of a memory of the present invention.

Referring now to the drawings, a preferred embodiment of the invention will be described. In this description, specific values used in discussing items such as buses, words, storage bits of memory, and the like are not limited to the values shown, since these values are used primarily for explanatory purposes.

Structure

As shown in FIG. 1, the system of the invention makes use of a CPU bus 100 that is electrically connected to a command and data register 102 and a CSR 103. The command register 102 and the CSR 103 are electrically connected by a data and command bus 104. The CSR 103 includes a plurality of data storage registers (shown in FIG. 2), which in a preferred embodiment comprise memory elements known as "flip-flops". Control logic 105 is electrically connected to the command and data register 102 via a bus 106; in addition, the control logic 105 is electrically connected to the CSR 103 via a bus 107. An error detecting and correcting circuit (EDC) 108 is electrically connected to the command register 102 by a bus 110, and is electrically connected to the CSR 103 by a bus 112. The EDC 108 includes a check bit generator 108a, an error detection circuit 108b, and an error correcting circuit 108c.

The EDC 108 is electrically connected to a memory module 114 via a bus 116. In a preferred embodiment, the memory module 114 comprises several banks of dynamic random access memories (DRAMs). "Memory bank" refers to the smallest independently addressable unit of memory, which in a preferred embodiment is about 70 RAM chips. The memory module 114 is addressable via an address bus 118.

Although FIG. 1 shows only a single memory module and a single CSR for ease of explanation, it is understood that a computing system utilizing the present invention will typically include multiple CSRs and multiple memory modules.

Figure 2:
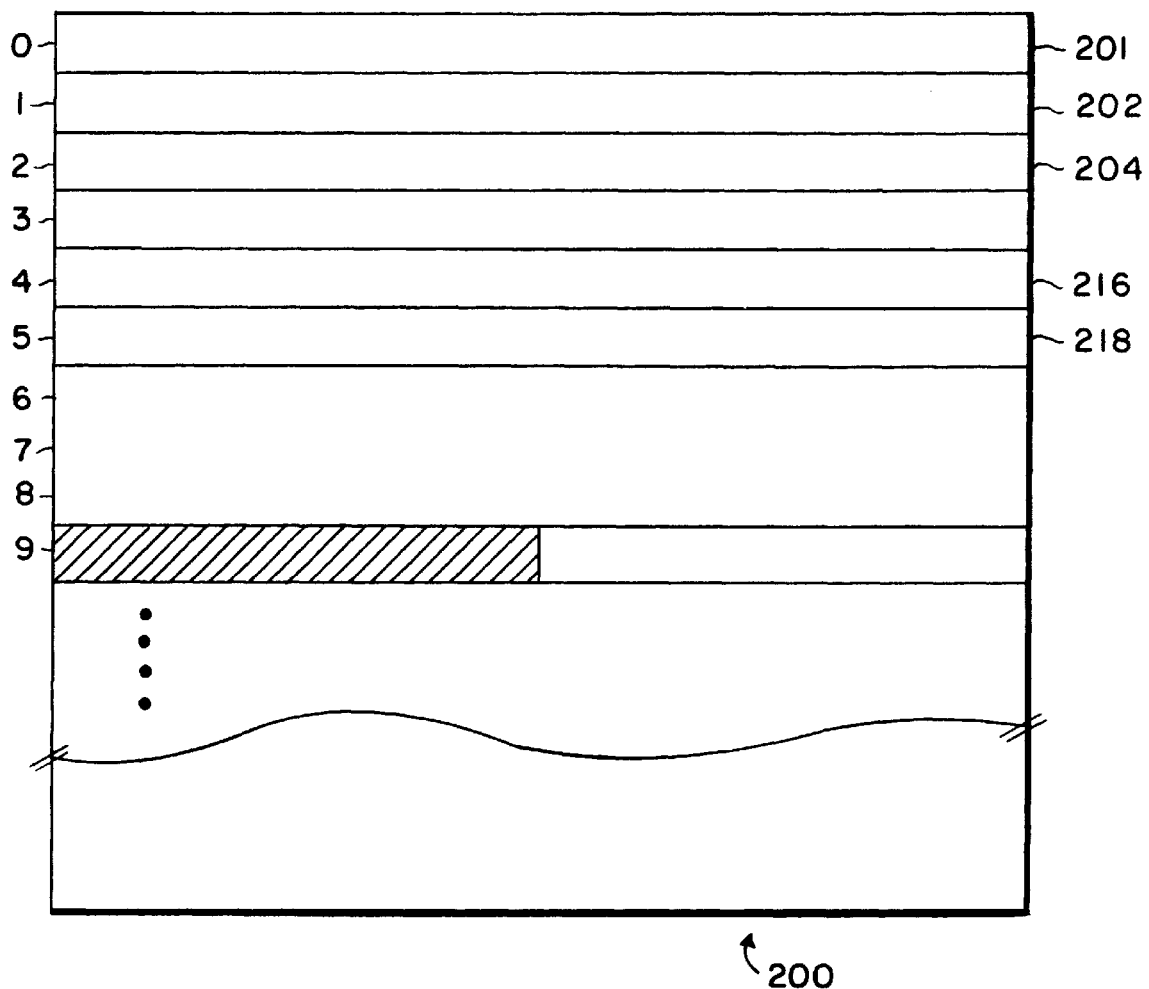
FIG. 2 is a diagram illustrating a representative CSR of the present invention.

Referring to FIG. 2, the memory registers 200 of the CSR 103 are shown. Basically, the registers 200 of the CSR 103 operate to store various signals in the event the memory module 114 experiences an error. The operation of the registers 200 will be described in greater detail below. Each register is represented by a horizontal row, and corresponds to a single address. In an example of a preferred embodiment, each register contains 31 bits. The memory registers 200 include an error register 201, a first command trap 202, a second command trap 204, an EDC status register 216, an EDC syndrome register 218, and a filter control register 220.

Referring to FIG. 3, an example of filter logic 300 of the invention comprises a plurality of digital logic gates including exclusive NOR gates 302–316, AND gates 332, 334, 336, and 338; NAND gate 340, and AND gates 342 and 344. Each of the exclusive NOR gates 302–316 has one input electrically connected to a different bit of the filter control register 220, with the other input being supplied by the error detecting circuit 108b. The outputs of the AND gates 332, 334, 336, and 338 are electrically connected to the NAND gate 340. The AND gate 342 receives input signals from the output of the NAND gate 340, and the error detecting circuit 108b, as described in greater detail below. Inputs to the AND gate 344 are provided by the output of the AND gate 342 and the control logic 105, as described in greater detail below.

Operation

EDC 108—Write Operation

During a typical write operation, the EDC circuit 108 receives a multi-bit data word from the bus 110. The data word comprises information that the computer (not shown) has placed on the CPU bus 100 for storage in the memory 114. The check bit generator 108a of the EDC circuit 108 calculates a number of check bits based upon the data word. In a preferred embodiment, the check bit generator 108a comprises a parity tree arrangement. The calculation of check bits using parity trees is sufficiently well known in the art that an ordinarily skilled artisan, equipped with this specification, would be able to design an arrangement of parity trees suitable for the check bit calculation required for the present invention. The data word and its check bits are stored in the memory 114.

EDC 108—Read Operation

During a typical read operation, the error detecting circuit 108b receives from the memory 114 a multi-bit data word and any check bits associated with that data word. The error detecting circuit 108b preferably employs a parity tree arrangement to determine whether the check bits received properly correspond to the data word received. The use of parity trees for such an error detecting function is sufficiently well known in the art that an ordinarily skilled artisan, equipped with this specification, would be able to design an arrangement of parity trees suitable for the present invention. If an error is detected, the error detecting circuit 108b generates a syndrome, which is used by the error correcting circuit 108c to correct the error detected by the circuit 108b. The syndrome indicates, for example, which bits of the data were found to be erroneous. Furthermore, the error detecting circuit 108b identifies the memory bank in which the read error occurred, and provides a signal identifying that memory bank. Also, the error detecting circuit 108b provides a signal indicating whether the memory error that has been detected is a correctable error or an uncorrectable error.

CSR 103

As mentioned above, the memory registers 200 of the CSR 103 function to store various signals each time the memory module 114 experiences an error. When a new error occurs, the signals associated with the new error are written to certain registers of the CSR 103 in place of the previous contents of such registers. When an error occurs, the error register 201 receives a plurality of signals from various error-indicating circuits (not shown) associated with the memory 114. For example, the error register 201 contains the parity of the erroneous data, any start or stop bits associated with the data, and the like. In a preferred embodiment of the invention, when an error occurs, the first command trap 202 is filled with bits 0–31 of the signal that was present on the CPU bus 110 when the error occurred. Similarly, the second command trap 204 is filled with bits 32–63 of the signal present on the CPU bus 110 when the error occurred. Bits 32–63 may contain information such as additional data, a command, and a code identifying the processor sending the signal on the CPU bus 100. The contents of the command traps 202 and 204 are obtained from the command and data register 102, which stores each signal sent on the CPU bus 100 for a pre-determined time period.

The EDC status register 216 contains the check bits that were generated by the check bit generator 108a based upon the erroneous data. The EDC syndrome register 218 contains the syndrome produced by the error detecting circuit 108b in response to the current memory error.

In contrast to the error registers described above, the filter control register 220 is not changed when an error is detected. In contrast, the filter control register 220 is set in advance of any error being detected by writing to the CSR 103. The bits that are set in the filter control register 220 operate to specify a particular error which is to be "filtered" or "masked". In other words, the filter logic 300, as described in greater detail below, prevents storage of memory errors that correspond to the user-specified characteristics indicated in the register 220. In a preferred embodiment, the bits of the filter control register 220 are designated as shown in Table I, below.

TABLE I

Filter Control Register 220

| | |
|---|---|
| 0 | EDC syndrome, bit 0 |
| 1 | EDC syndrome, bit 1 |
| 2 | EDC syndrome, bit 2 |
| 3 | EDC syndrome, bit 3 |
| 4 | EDC syndrome, bit 4 |
| 5 | EDC syndrome, bit 5 |
| 6 | EDC syndrome, bit 6 |
| 7 | EDC syndrome, bit 7 |
| 8 | EDC syndrome, bit 8 |
| 9 | EDC syndrome, bit 9 |
| 10 | EDC syndrome, bit 10 |
| 11 | EDC syndrome, bit 11 |
| 12 | Memory Bank, bit 0 |
| 13 | Memory Bank, bit 1 |
| 14 | Enable |

In this example, bits 0–11 of the register 220 are used to identify the syndrome of a particular error to be filtered. Likewise, bits 12–13 are used to identify the memory bank from which errors should be filtered. The operation of the filter is enabled or disabled depending upon the contents of bit 14 (the "enable" bit) of the register 220. To enable the filter, a digital 1 is stored in bit 14; to disable the filter, a digital 0 is stored in bit 14. Therefore, if bit 14 of the register 220 contains a digital 1, the filter logic 300 operates to prevent storage in the CSR 103 of information associated with errors corresponding to the syndrome and memory bank specified in the register 220.

Control Logic 105

Generally, the control logic 105 is a state machine that coordinates the operations of the command and data register 102 and the CSR 103. For example, the control logic 105 provides a write timing signal to the CSR 103, which determines when the CSR 103 is able to store signals associated with errors that occur during the reading or writing of data to the memory 114. In particular, the control logic 105 provides a "CSR write timing signal" that is used to clock the storage of data in the "flip-flops" of the CSR 103. Additionally, the control logic 105 provides a "CSR read timing signal", which enables the memory 114 to read data onto the bus 116. Also, the control logic 105 provides an "ACK" signal to acknowledge read and write signals received from the CPU bus 100.

Filter Logic 300

The filter logic 300 performs two basic functions: to determine when a memory error matches the user-selected specifications stored in the register 220, and to prevent storage of information associated with that matching error into the CSR 103.

The filter logic 300 uses the exclusive NOR gates 302–316 to determine whether a memory error matches the user-selected specifications stored in the filter control register 220. Specifically, the exclusive NOR gates 302–314 digitally compare bits 0–11 of the filter control register 220 to the syndrome generated by the error detecting circuit 108b. Similarly, the exclusive NOR gates 315–316 digitally compare bits 12–13 of the filter control register 220 to the memory bank identifying signals provided by the error detecting circuit 108b. If the compared signals are identical, and if bit 14 (the enable bit) of the filter control register 202 has been set to digital 1, the inputs to the AND gates 332, 334, 336, and 338 will all be digital 1. Accordingly, the inputs to the NAND gate 340 will also be equal to digital 1, and the NAND gate 340 will produce a digital 0 at its output.

In this case, even if the error is determined by the error detecting circuit 108b to be a correctable error, which would cause a digital 1 to appear on the "corresponding error signal" input to the AND gate 342, the output of the AND gate 342 will be a digital 0. This in turn prevents the AND gate 344 from providing a digital 1, even when the "CSR write timing signal" of the control logic 105 is a digital 1. Therefore, in this case, the memory registers of the CSR 103 will be prevented from storing information associated with the memory error that has been detected, thus preserving the CSR 103 for storage of information associated with other errors.

However, if one or more of the exclusive NOR gates 302–316 do not produce a digital 1, this means that either the compared syndromes or memory bank identifying signals do not match. As a result, one or more of the AND gates 332, 334, 336, and/or 338 will produce a digital 0, which in turn will cause the NAND gate 340 to produce a digital 1. As a result, the AND gate 342 will be allowed to produce a digital 1 if the "correctable error" signal is a digital 1; this will occur if the error is determined to be a correctable error by the error detecting circuit 108b. In this case, the AND gate 344 will be allowed to produce a digital 1 when the "CSR write timing" signal of the control logic 105 is a digital 1, causing the memory registers of the CSR 103 to store information associated with the detected memory error.

The present invention provides a number of advantages over prior arrangements. Specifically, the present invention enables a lesser number of CSRs 103 to be used for each memory module, since the CSR 103 and filter logic 300 may be programmed to selectively prevent data associated with more frequent errors from being stored in the CSR 103. Accordingly, data from less frequent errors is not as likely to be written-over and lost, and the reliability of the computing system is increased. Moreover, the invention does not require any supplemental memory since the existing CSR 103 is utilized, and the invention does not appreciably delay operation of the computing system since operation of the filter logic 300 is rapid.

While there have been shown what are presently considered to be preferred embodiments of the invention, it will be apparent to those skilled in the art that various changes and modifications can be made herein without departing from the scope of the invention as defined by the appended claims.

What is claimed is:

1. A data processing system for an electronic computing system, comprising:

one or more memory banks;

error detecting circuitry to detect errors that occur in the memory banks when data is read from or written to the memory banks, and to provide signals representative of the errors;

a command and status register including:

memory registers for storing data associated with errors that occur in the memory banks; and a filter control register for storing a filter signal identifying a predetermined user specified error; and filter logic for selectively preventing the storage of any data in the command and status register when the representative data matches the filter signal.

2. The data processing system of claim 1, wherein the representative signals include syndromes associated with the error.

3. The data processing system of claim 1, wherein the representative signals include signals indicative of the memory bank in which the error occurred.

4. The data processing system of claim 1, wherein the filter logic prevents the storage of data in the command and status register by suppressing a clock signal of the command and status register.

5. A data processing method for an electronic computing system having one or more memory banks, comprising the steps of:

detecting an error that has occurred in one of the memory banks when data is read from or written to the memory bank;

generating signals representative of the error;

comparing the representative signals to the contents of a filter control register, the filter control register storing a filter signal identifying a predetermined user specified error;

in the event the representative signals do not match the contents of the filter control register, storing data associated with the error in a command and status register;

in the event the representative signals match the contents of the filter control register, preventing the storage of any data in the command and status register.

6. The method of claim 5, wherein the representative signals include syndromes associated with the error.

7. The method of claim 5, wherein the representative signals include signals representative of the memory bank in which the error occurred.

8. The method of claim 5, wherein the step of comparing is performed by a plurality of digital logic gates.

9. The method of claim 5, wherein the step of preventing the storage of any data in the command and status register is accomplished by suppressing a clock signal of the command and status register.

* * * * *